United States Patent
Lin et al.

(10) Patent No.: US 10,276,634 B2
(45) Date of Patent: Apr. 30, 2019

(54) SEMICONDUCTOR MEMORY STRUCTURE WITH MAGNETIC TUNNEL JUNCTION (MTJ) CELL

(71) Applicant: Taiwan Semiconductor Manufacturing Co., Ltd., Hsinchu (TW)

(72) Inventors: Shih-Wei Lin, Taipei (TW); Yuan-Tai Tseng, Zhubei (TW); Shih-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/627,646

(22) Filed: Jun. 20, 2017

(65) Prior Publication Data

US 2018/0366517 A1 Dec. 20, 2018

(51) Int. Cl.
| H01L 27/22 | (2006.01) |
| H01L 43/02 | (2006.01) |
| H01L 43/12 | (2006.01) |
| H01L 43/08 | (2006.01) |

(52) U.S. Cl.
CPC ............ *H01L 27/228* (2013.01); *H01L 43/02* (2013.01); *H01L 43/12* (2013.01); *H01L 43/08* (2013.01)

(58) Field of Classification Search
CPC .................................................. H01L 27/228
See application file for complete search history.

(56) References Cited

U.S. PATENT DOCUMENTS

| 6,028,362 | A | * | 2/2000 | Omura | ............... H01L 21/76807 |
| | | | | | 257/751 |
| 7,723,128 | B2 | * | 5/2010 | Wang | .................... H01L 27/228 |
| | | | | | 257/295 |
| 7,760,473 | B2 | * | 7/2010 | Ide | .......................... B82Y 25/00 |
| | | | | | 360/324.11 |
| 9,142,762 | B1 | * | 9/2015 | Li | ........................... H01L 43/12 |
| 9,231,193 | B2 | | 1/2016 | Iwayama et al. | |
| 9,306,152 | B2 | | 4/2016 | Iwayama et al. | |
| 9,343,659 | B1 | * | 5/2016 | Lu | ............................ H01L 43/02 |
| 9,450,183 | B2 | * | 9/2016 | Huang | ................ H01L 45/1273 |
| 9,502,466 | B1 | * | 11/2016 | Chuang | .................. H01L 27/222 |
| 2004/0205958 | A1 | | 10/2004 | Grynkewich et al. | |

(Continued)

OTHER PUBLICATIONS

Non-Final Office Action dated Feb. 5, 2018, issued in U.S. Appl. No. 15/627,651.

(Continued)

*Primary Examiner* — Eugene Lee
(74) *Attorney, Agent, or Firm* — McClure, Qualey & Rodack, LLP

(57) ABSTRACT

A semiconductor memory structure is provided. The semiconductor memory structure includes a bottom electrode formed over a substrate and a magnetic tunneling junction (MTJ) cell formed over the bottom electrode. The semiconductor memory structure includes a top electrode formed over the MTJ cell and a passivation layer surrounding the top electrode. The passivation layer has a recessed portion that is lower than a top surface of the top electrode. The semiconductor memory structure further includes a cap layer formed on the top electrode and the passivation layer, wherein the cap layer is formed in the recessed portion.

20 Claims, 11 Drawing Sheets

(56) References Cited

U.S. PATENT DOCUMENTS

| | | | |
|---|---|---|---|
| 2006/0227467 A1* | 10/2006 | Ide | B82Y 25/00 |
| | | | 360/324.11 |
| 2009/0261433 A1 | 10/2009 | Kang et al. | |
| 2009/0302362 A1* | 12/2009 | Kikuchi | H01L 27/11502 |
| | | | 257/295 |
| 2010/0102404 A1 | 4/2010 | Li et al. | |
| 2011/0037108 A1* | 2/2011 | Sugiura | H01L 27/228 |
| | | | 257/295 |
| 2011/0229985 A1* | 9/2011 | Li | H01L 43/12 |
| | | | 438/3 |
| 2011/0272380 A1* | 11/2011 | Jeong | H01L 27/228 |
| | | | 216/22 |
| 2012/0086089 A1 | 4/2012 | Li et al. | |
| 2012/0252184 A1* | 10/2012 | Ninomiya | C23C 26/00 |
| | | | 438/382 |
| 2013/0119494 A1 | 5/2013 | Li et al. | |
| 2013/0155761 A1 | 6/2013 | Aoki | |
| 2014/0042567 A1 | 2/2014 | Jung et al. | |
| 2014/0198564 A1 | 7/2014 | Guo | |
| 2015/0061052 A1 | 3/2015 | Huang et al. | |
| 2015/0255507 A1 | 9/2015 | Pakala et al. | |
| 2016/0072045 A1 | 3/2016 | Kanaya et al. | |
| 2016/0268499 A1* | 9/2016 | You | H01L 43/12 |
| 2016/0351792 A1* | 12/2016 | Jiang | H01L 43/02 |
| 2016/0380183 A1* | 12/2016 | Chuang | H01L 43/12 |
| | | | 257/421 |

OTHER PUBLICATIONS

Final Office Action dated Aug. 8, 2018, issued in U.S. Appl. No. 15/627,651.

* cited by examiner

SEMICONDUCTOR MEMORY STRUCTURE WITH MAGNETIC TUNNEL JUNCTION (MTJ) CELL

CROSS REFERENCE TO RELATED APPLICATIONS

This application is related to the following co-pending a commonly assigned patent application: U.S. application Ser. No. 15/627,651, filed on Jun. 20, 2017 and entitled "Semiconductor Memory Structure with Magnetic Tunnel Junction (MTJ) Cell", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Magnetic Random Access Memory (MRAM), based on the integration of silicon CMOS with Magnetic Tunneling Junction (MTJ) technology, is a major emerging technology that is highly competitive with existing semiconductor memories such as Static Random Access Memory (SRAM), Dynamic Random Access Memory (DRAM), and Flash.

Although existing semiconductor memory structures and methods for forming the same have been generally adequate for their intended purposes they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
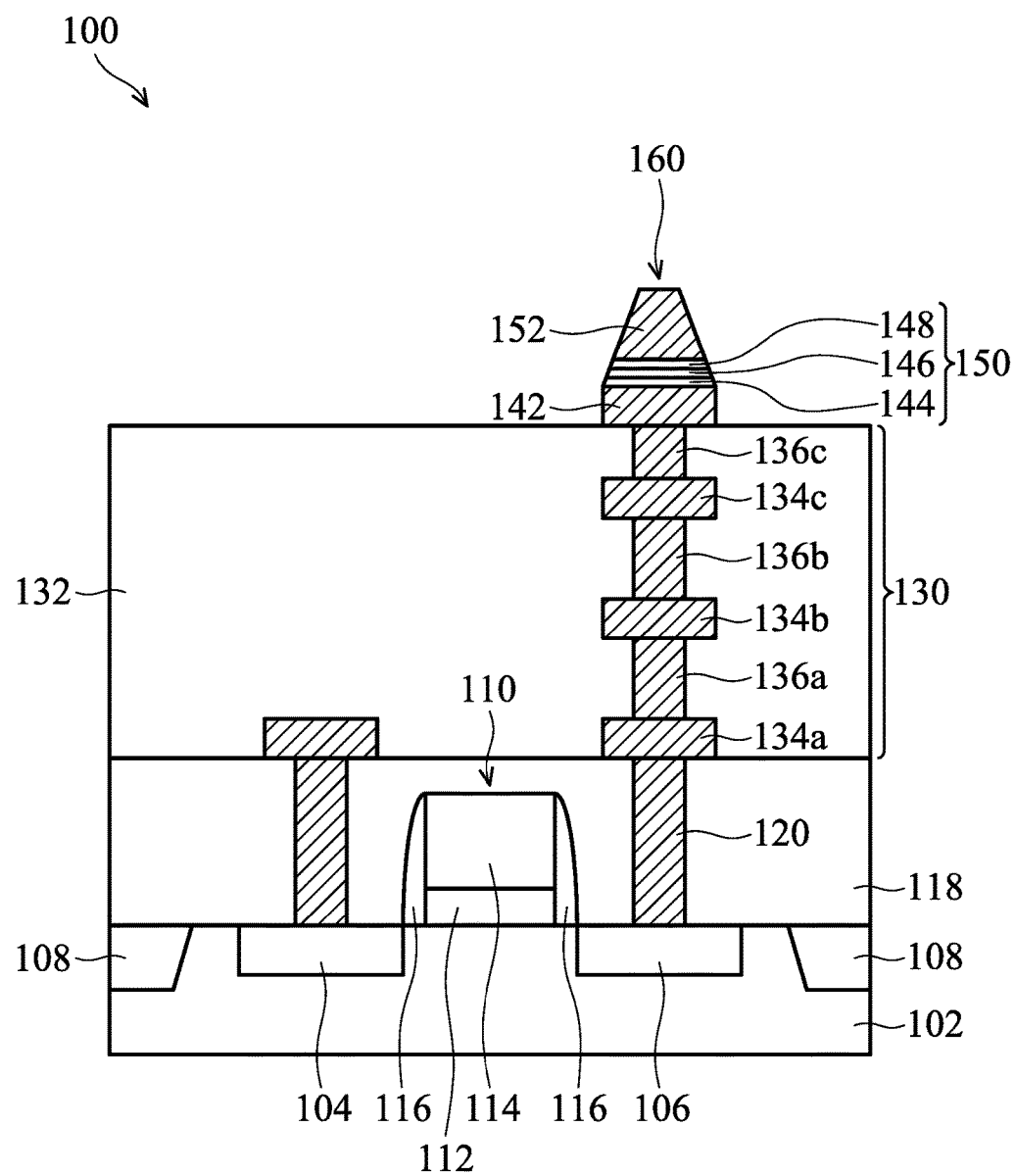
FIGS. 1A-1H show cross-sectional representations of various stages of forming a semiconductor memory structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor memory structure and method for forming the same are provided. FIGS. 1A-1H show cross-sectional representations of various stages of forming a semiconductor memory structure 100, in accordance with some embodiments of the disclosure. In some embodiments, the semiconductor memory structure 100 is a magnetic random access memory (MRAM). The semiconductor memory structure 100 includes a magnetic tunnel junction (MTJ) cell between a bottom electrode and a top electrode, and a cap layer is formed over the top electrode.

Referring to FIG. 1A, a substrate 102 is provided. The substrate 102 may be made of silicon or another semiconductor material. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A transistor device 110 is formed over the substrate 102. A source region 104 and a drain region 106 are formed in the substrate 102. The source region 104 and the drain region 106 are formed at opposite sides of the transistor device 110. In some embodiments, the source region 104 and the drain region 106 are doped regions. The doped regions may be doped with n-type and/or p-type dopants. In some embodiments, the doped regions are formed by an ion implantation process, a diffusion process, or another applicable process.

An isolation structure 108, such as shallow trench isolation (STI) structures or local oxidation of silicon (LOCOS) structures, is formed in the substrate 102. The isolation structure 108 may define and isolate various integrated circuit devices.

The transistor device 110 includes a gate dielectric layer 112 and a gate electrode layer 114 over the gate dielectric layer 112. The gate dielectric layer 112 is made of silicon oxide, silicon nitride, or a high dielectric constant material (high-k material). In some embodiments, the gate dielectric layer 112 is formed by a chemical vapor deposition (CVD) process.

The gate electrode layer 114 may be made of polysilicon or conductive material. The conductive material may include metal (e.g., tantalum, titanium, molybdenum, tungsten, platinum, aluminum, hafnium, ruthenium), a metal silicide (e.g., titanium silicide, cobalt silicide, nickel silicide, tantalum silicide), or a metal nitride (e.g., titanium nitride, tantalum nitride). In some embodiments, the gate electrode layer 114 is formed by a deposition process, such as a chemical vapor deposition (CVD) process or a physical vapor deposition (PVD) process.

The gate spacers 116 are formed on sidewalls of the transistor device 110. In some embodiments, the gate spacers 116 are made of silicon oxide, silicon nitride, silicon oxynitride or another applicable material. In some embodiments, the gate spacers 116 are formed by a chemical vapor deposition (CVD) process or a physical vapor deposition (PVD) process.

An inter-layer dielectric (ILD) layer 118 is formed on the substrate 102 and over the transistor device 110, and a contact structure 120 is formed on the source region 104 and the drain region 106. The ILD layer 118 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or another applicable dielectric material. The ILD layer 118 may be formed by a deposition process, such as a chemical vapor deposition (CVD), a physical vapor deposition (PVD), an atomic layer deposition (ALD), a spin-on coating, or another applicable process.

An interconnect structure 130 is formed over the substrate 102 and the ILD layer 118. The interconnect structure 130 is used to electrically connect the signal of the transistor device 110 to the external environment.

The interconnect structure 130 includes multiple conductive features formed in a first dielectric layer 132 (such as inter-metal dielectric, IMD). The first dielectric layer 132 includes multiple dielectric layers. The first dielectric layer 132 may include silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the first dielectric layer 132 is formed by a deposition process, such as a chemical vapor deposition (CVD) process, a spin-on process, a sputtering process, or a combination thereof.

In some embodiments, the first dielectric layer 132 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

The conductive features include a number of conductive lines 134a, 134b and 134c and a number of conductive vias 136a, 136b and 136c. Each of the conductive lines 134a, 134b and 134c is electrically connected to one of the conductive vias 136a, 136b and 136c. The conductive lines 134a, 134b and 134c are electrically connected to the drain region 106 through the contact structure 120. In some embodiments, the first conductive line 134a is called a first metal layer ($M_1$), the second conductive line 134b is called a second metal layer ($M_2$), the third conductive line 134c is called a third metal layer ($M_3$).

In some embodiments, the conductive features are made of metal materials, such as copper (Cu), aluminum (Al), titanium (Ti), tantalum (Ta), nickel (Ni), silver (Ag), gold (Au), indium (In), tin (Sn), or a combination thereof. In some embodiments, the conductive features are formed by electro-plating, electroless plating, sputtering, chemical vapor deposition (CVD) or another applicable process.

The conductive lines 134a, 134b and 134c and the conductive vias 136a, 136b and 136c as illustrated are exemplary, and the actual positioning and configuration of the conductive lines 134a, 134b and 134c and the conductive vias 136a, 136b and 136c may vary according to actual application.

Afterwards, a memory device 160 is formed over the first dielectric layer 132. The memory device 160 includes a bottom electrode 142, an MTJ (Magnetic Tunnel Junction) cell 150 and a top electrode 152. The MTJ cell 150 is the core of the memory device 160. The MTJ cell 150 includes at least three layers. The bottom electrode 142 is formed on the conductive vias 136c, the MTJ cell 150 is formed on the bottom electrode 142, and the top electrode 152 is formed on the MTJ cell 150. In other words, the MTJ cell 150 is between the bottom electrode 142 and the top electrode 152.

The bottom electrode 142 is electrically connected to the drain region 106 through the conductive features of the interconnect structure 130. The bottom electrode 142 is made of conductive material, such as tantalum (Ta), titanium (Ti), platinum (Pt), copper (Cu), tungsten (W), aluminum (Al), titanium nitride (TiN), tantalum nitride (TaN), and tungsten silicide (WSi), tantalum nitride (TaN), or another applicable material. In some embodiments, the bottom electrode 142 is formed by electro-plating, electroless plating, sputtering, chemical vapor deposition (CVD) or another applicable process.

The MTJ cell 150 includes a first ferromagnetic layer 144, an insulator layer 146 and a second ferromagnetic layer 148. The first ferromagnetic layer 144 is formed on the bottom electrode 142, the insulator layer 146 is formed on the first ferromagnetic layer 144 and the second ferromagnetic layer 148 is formed on the insulator layer 146. The bottom electrode 142 is electrically connected to the first ferromagnetic layer 144 (or called pin layer), and the top electrode 152 is electrically connected to the second ferromagnetic layer 148 (or called free layer).

The MTJ cell 150 has a structure of ferromagnetic layer/insulation layer/ferromagnetic layer. When electrons having passed through a first ferromagnetic layer pass through an insulation layer served as a tunneling barrier, a tunneling probability changes depending on a magnetization direction of a second ferromagnetic layer. The tunneling probability becomes a maximum value when the magnetization directions of the two ferromagnetic layers are parallel to each other and the tunneling probability becomes a minimum when the magnetization directions of the two ferromagnetic layers are anti-parallel to each other. The amount of the tunneling current flowing between two ferromagnetic layers depends on the tunneling probability. For example, it may be considered that data '1' (or '0') is written when the tunneling current is large and data '0' (or '1') is written when the tunneling current is small. One of the two ferromagnetic layers serves as a fixed magnetic layer whose magnetization direction is fixed, and the other serves as a free magnetic layer whose magnetization direction is changed in response to an external magnetic field or electric current.

The first ferromagnetic layer 144 is a pin layer in which a magnetization state is fixed, and the second ferromagnetic layer 148 is a free layer in which a magnetization state varies depending upon a stored data. The insulator layer 146 is a non-magnetic layer sandwiched between the first ferromagnetic layer 144 and the second ferromagnetic layer 148. The first ferromagnetic layer 144 may be a single layer or a multiple layers, and the second ferromagnetic layer 148 may be a single layer or a multiple layers. In some embodiments, the first ferromagnetic layer 144 and the second ferromagnetic layer 148 are independently made of the materials with ferromagnetism, such as Cobalt-Iron-Boron (CoFeB), CoFe, and Nickel-Iron (NiFe), Co, Fe, Ni, FeB, or FePt. The first ferromagnetic layer 144 and the second ferromagnetic layer 148 are made of different materials. In some embodiments, the first ferromagnetic layer 144 is made of CoxFeyBz (x, y z is the atomic composition ratio), the second ferromagnetic layer 148 is made of CoxFeyBz, and the x, y, z in the first ferromagnetic layer 144 is different from the x, y, z in the second ferromagnetic layer 148. In some embodiments, the first ferromagnetic layer 144 and the second ferromagnetic layer 148 are independently formed by electro-plating, electroless plating, sputtering, chemical vapor deposition (CVD) or another applicable process.

The insulator layer 146 is made of dielectric layer, such as Magnesium Oxide (MgO), Aluminum Oxides (AlOx or $Al_2O_3$), or Titanium Oxides (TiOx or $TiO_2$). In some embodiments, the insulator layer 146 is made of Magnesium Oxide (MgO). In some embodiments, the insulator layer 146 is formed by a deposition process, such as a chemical vapor deposition (CVD), a physical vapor deposition (PVD), an atomic layer deposition (ALD), a spin-on coating, or another applicable process.

The top electrode 152 is made of conductive material, such as tantalum (Ta), titanium (Ti), platinum (Pt), copper (Cu), tungsten (W), aluminum (Al), titanium nitride (TiN), tantalum nitride (TaN), and tungsten silicide (WSi), tantalum nitride (TaN), or another applicable material. In some embodiments, the top electrode 152 is formed by electro-plating, electroless plating, sputtering, chemical vapor deposition (CVD) or another applicable process.

The first ferromagnetic layer 144 has a bottom surface with a bottom width, the second ferromagnetic layer 148 has a top surface with a top width, and the bottom width is greater than the top width. The MTJ cell 150 has a sloped sidewall surface which is not vertically to the top surface of the first dielectric layer 132. The MTJ cell 150 has a tapered width which is gradually tapered from the bottom width of the first ferromagnetic layer 144 to the top width of the second ferromagnetic layer 148. In addition, a width of the bottom electrode 142 is greater than a width of the top electrode 152.

Figure 1B:
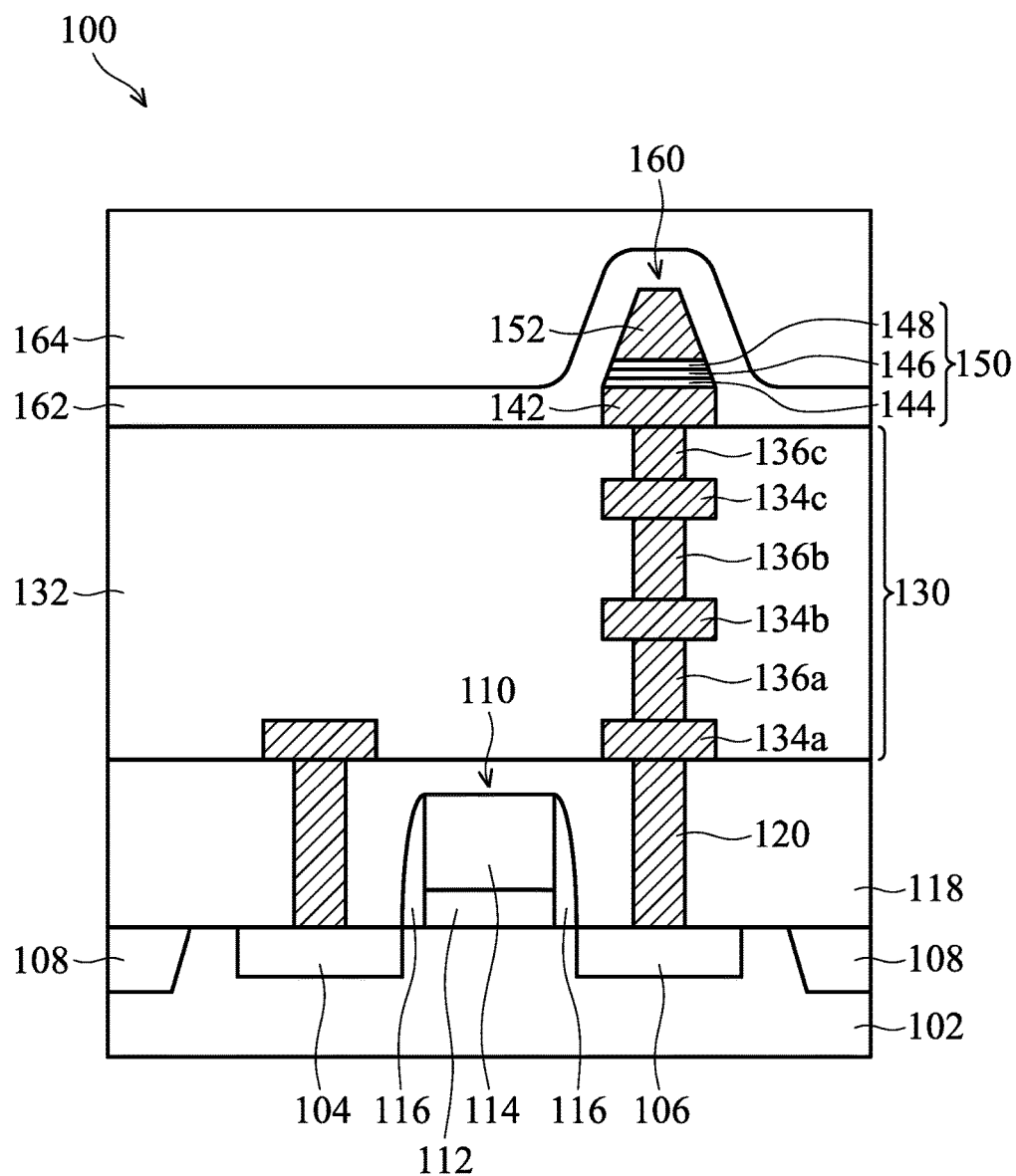

Next, as shown in FIG. 1B, a passivation layer 162 is formed on the first dielectric layer 132 and the memory device 160, and afterwards a second dielectric layer 164 is formed over the passivation layer 162, in accordance with some embodiments of the disclosure. The passivation layer 162 surrounds the MTJ cell 150 and the bottom electrode 142.

The passivation layer 162 is configured to protect the underlying layers from being damaged or polluted by the outer environment, such as air or water vapor. The passivation layer 162 is made of dielectric layer. The passivation layer 162 may include non-organic materials, such as silicon oxide (SiOx), un-doped silicate glass, silicon oxynitride (SiON), solder resist (SR), silicon nitride (SixNy), HMDS (hexamethyldisilazane). In some other embodiments, the passivation layer 162 is made of a polymer material, such as polyimide (PI), epoxy, or fluorine (F)-containing polymer.

Figure 1C:
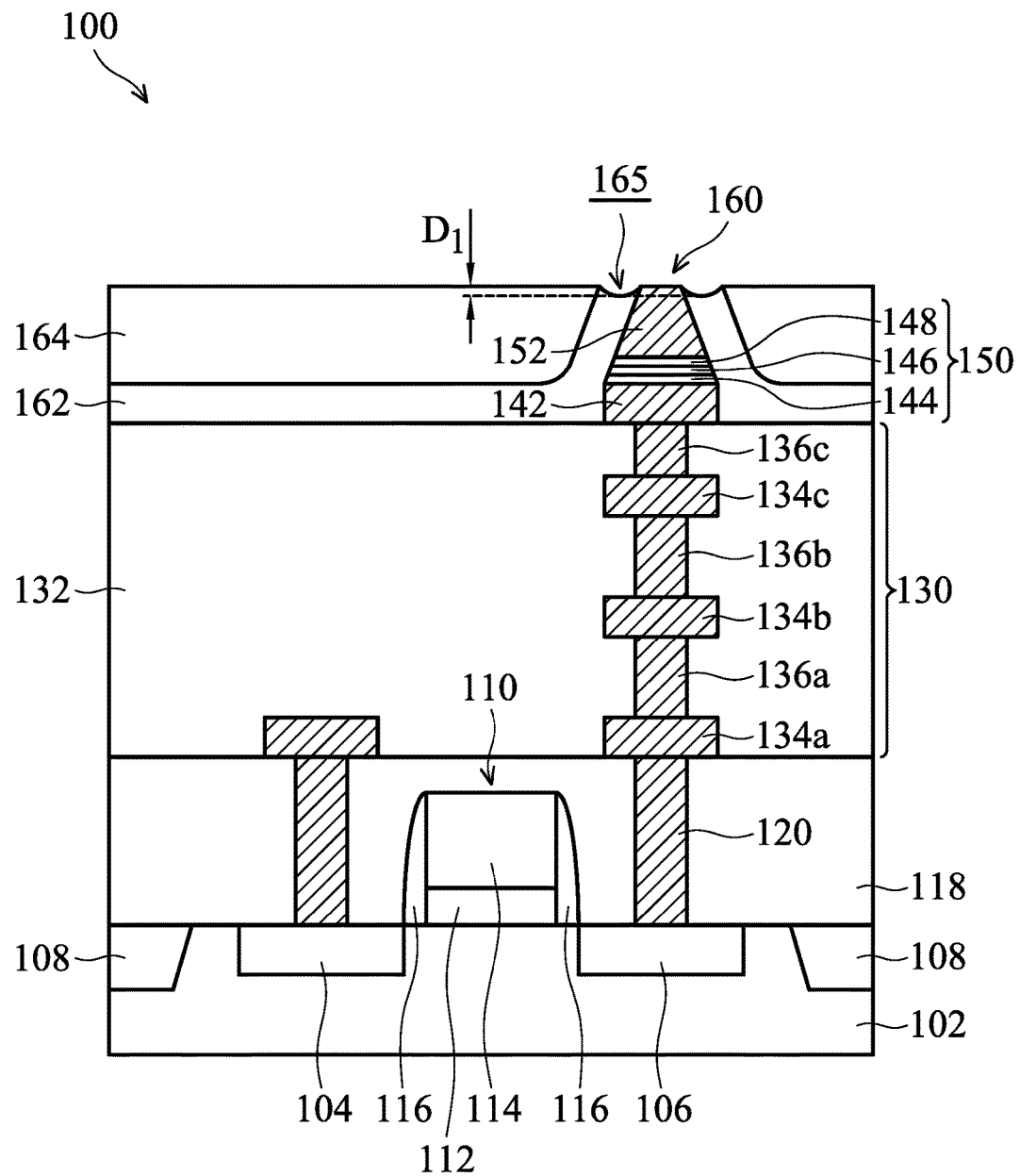

Next, as shown in FIG. 1C, a portion of the second dielectric layer 164 is removed, in accordance with some embodiments of the disclosure. In some embodiments, the portion of the second dielectric layer 164 is removed by a multiple removal processes. In some embodiments, a polishing process, such as a chemical mechanical polishing (CMP) process is performed is firstly performed, and afterwards an etching process is performed to remove the portion of the second dielectric layer 164.

After performing the removal processes, a portion of the second dielectric layer 164 and a portion of the passivation layer 162 are recessed because the etching resistance of the passivation layer 162 is not good enough. As a result, a recess 165 is formed. The passivation layer 162 has a recessed portion that is lower than the top surface of the top electrode 152. The top surface and a portion of the sidewall surface of the top electrode 152 are exposed by the recess 165. If the recess 165 is too deep, a contact structure made of conductive material which is filled in the recess 165 in the subsequent process may be in contact with the MTJ cell 150. The unwanted contact may increase the risk of the electrical shorting. In order to prevent the electrical shorting problem, a cap layer 170 is formed over the top electrode 152 in the subsequent process. The recess 165 has a first depth $D_1$ which is the distance between the lowest point and the top surface of the second dielectric layer 164. In some embodiments, the first depth $D_1$ of the recess 165 is in a range from about 5 nm to about 20 nm.

It should be noted that since the top electrode 152 has a high etching selectivity with respect to the passivation layer 162, the top electrode 152 is substantially not removed when the portion of the passivation layer 162 is removed. Therefore, the top surface of the top electrode 152 is level with a top surface of the second dielectric layer 164.

Figure 1D:
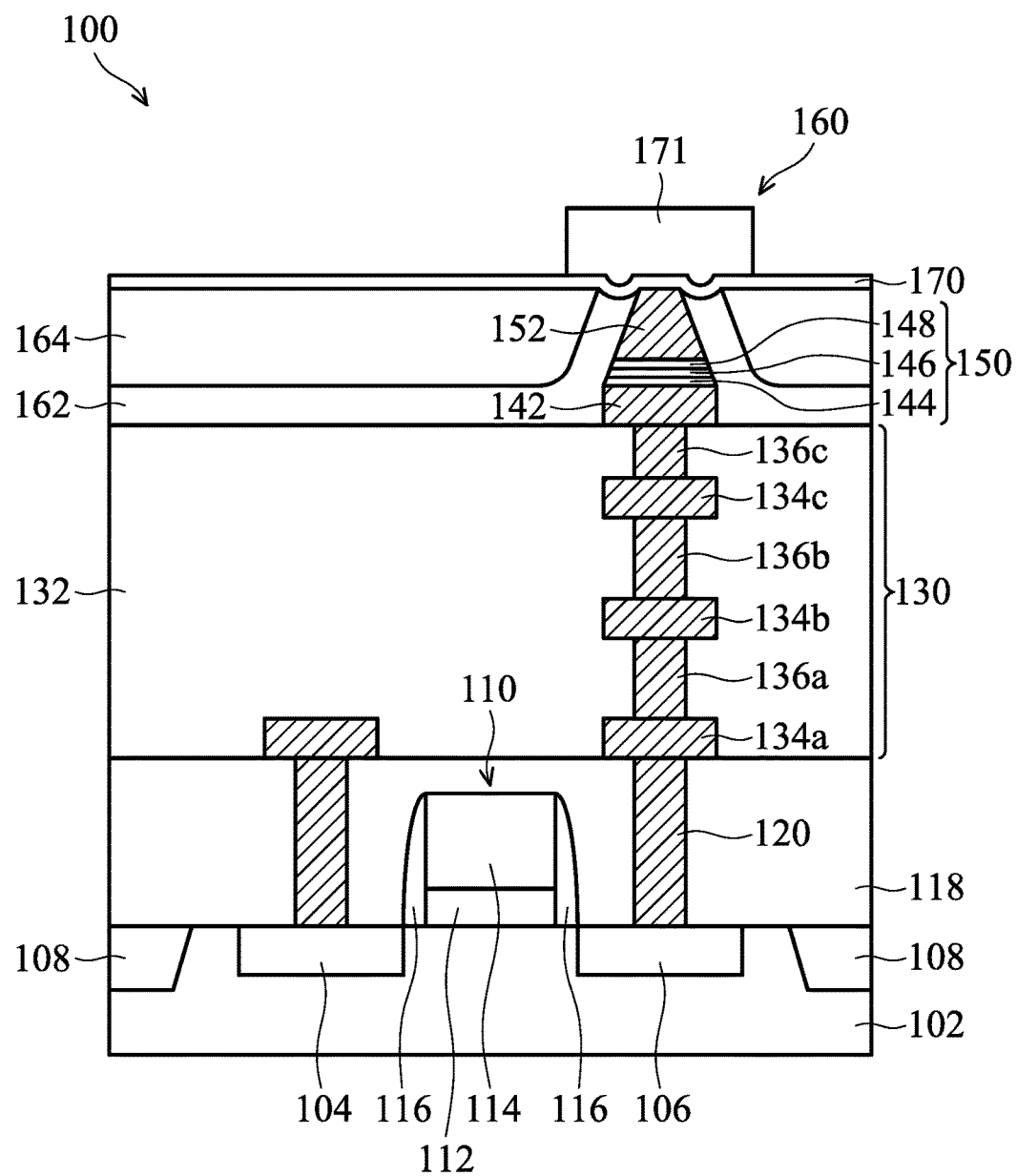

As shown in FIG. 1D, the cap layer 170 is formed in the recess 165 and on the exposed top surface of the top electrode 152, in accordance with some embodiments of the disclosure. Afterwards, a hard mask layer 171 is formed on the cap layer 170. The cap layer 170 is configured to protect the underlying layer from being etched or damaged. In addition, the cap layer 170 is used to prevent the top electrode 152 being oxidized.

The cap layer 170 is conformally formed on the second dielectric layer 164, the passivation layer 162 and a portion of the top electrode 152. The cap layer 170 is smaller than the passivation layer 162. In some embodiments, the cap layer 170 has a thickness in a range from 5 nm to about 50 nm. Since the cap layer 170 is a thin film, therefore the cap layer 170 has a recess portion (alternatively, a protruding portion) which is formed in the recess 165. On the other hand, the cap layer 170 includes a planar portion which is directly above the planar top surface of the second dielectric layer 164 and a protruding portion (alternatively, a recessed portion) which extends into the passivation layer 162. The bottom surface of the protruding portion is lower than the top surface of the top electrode 152.

The cap layer 170 is used to electrically connect or conduct the top electrode 152, and thus it is made of conductive materials. In addition, the cap layer 170 provides a high etching selectivity with respect to a third dielectric layer 174 (as shown in FIG. 1F). In some embodiments, the cap layer 170 is made of tantalum (Ta), titanium (Ti), W (tungsten), tantalum nitride (TaN), titanium nitride (TiN), tungsten nitride (WN), or a combination thereof. In some embodiments, the cap layer 170 is formed by a deposition process, such as chemical vapor deposition (CVD) process, physical vapor deposition (PVD) process or another applicable process.

As shown in FIG. 1D, the cap layer 170 is patterned by using the hard mask layer 171 as a mask, in accordance with some embodiments of the disclosure. The cap layer 170 is patterned by a patterning process. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

Figure 1E:
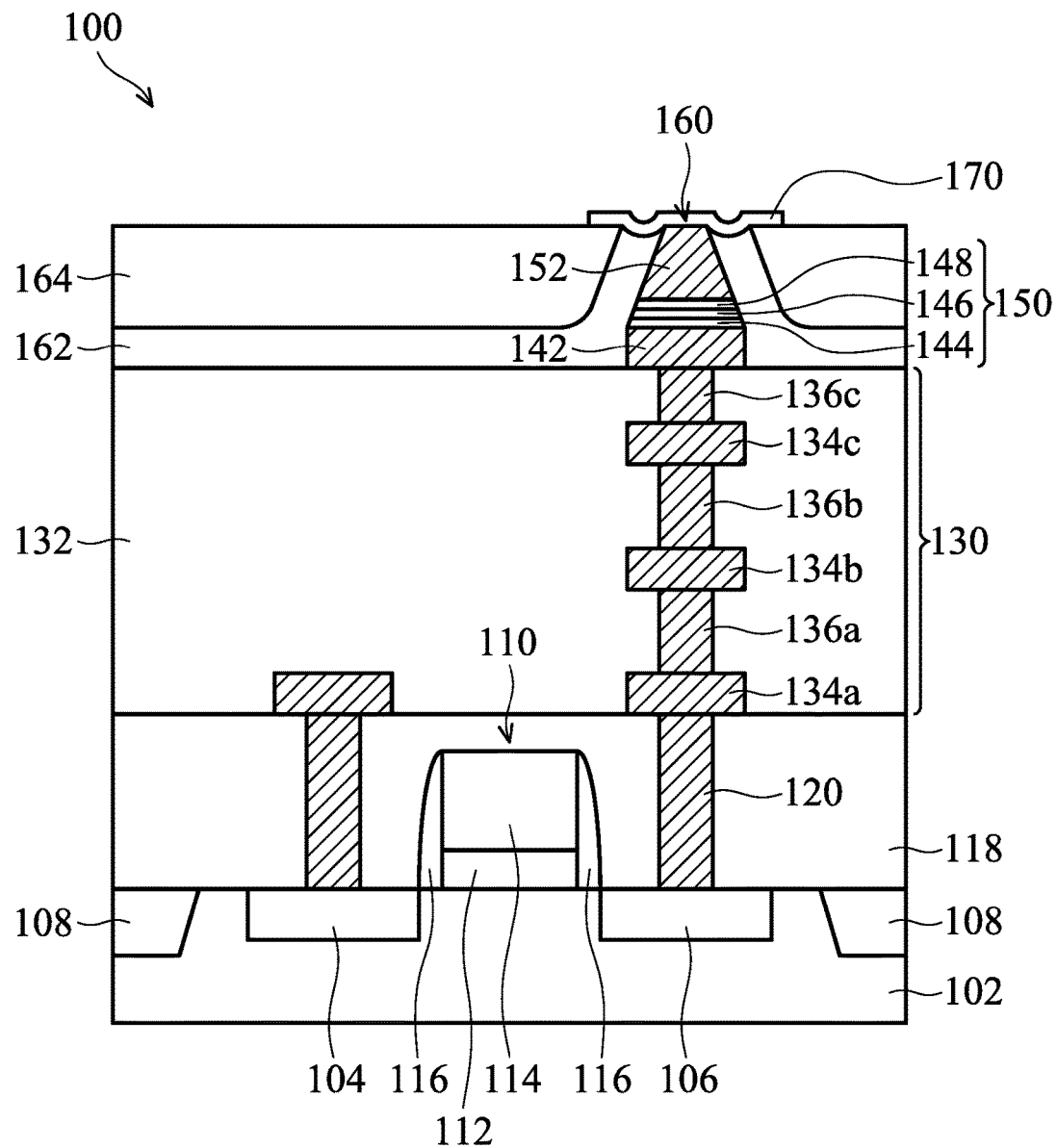
Figure 1F:
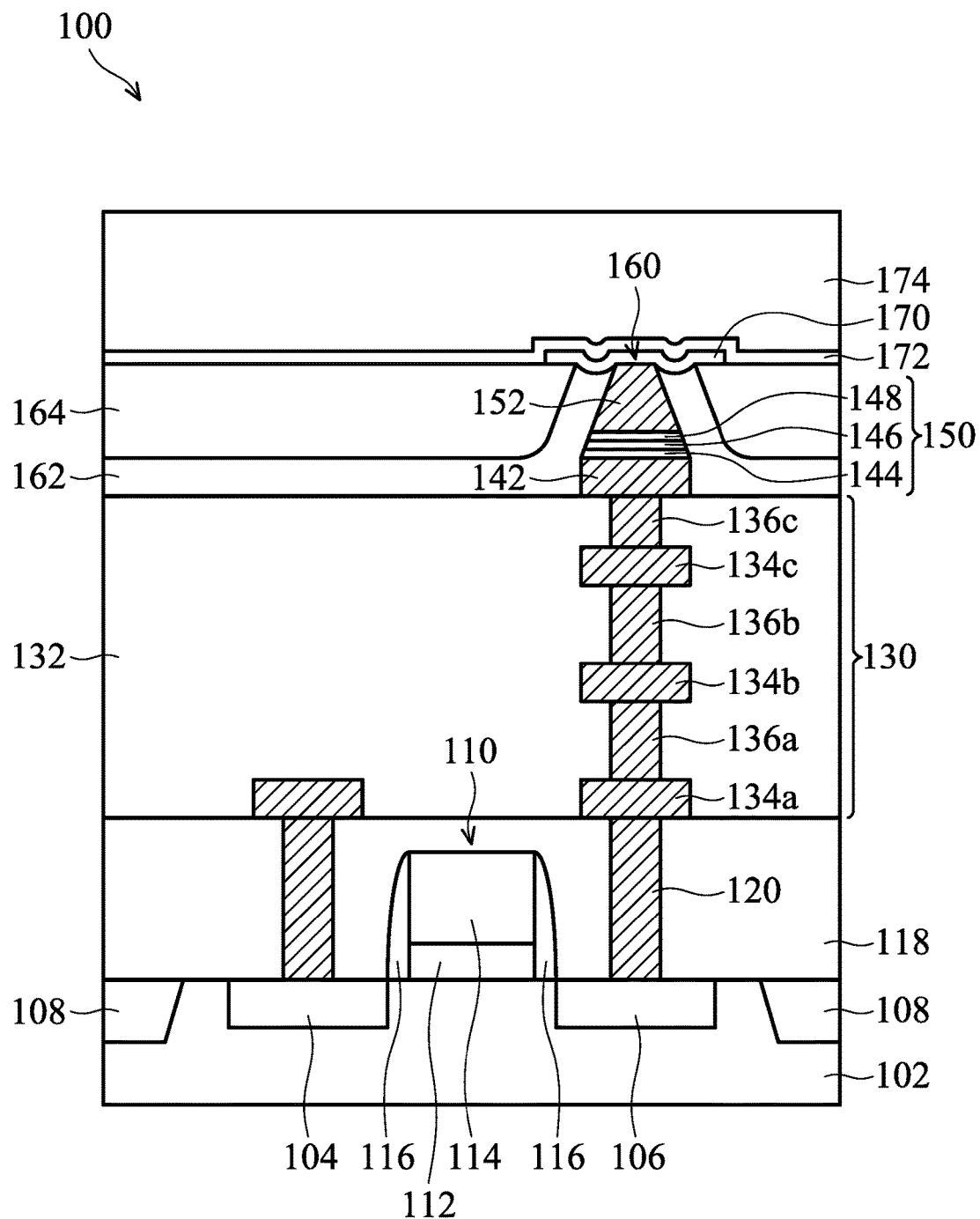

Afterwards, as shown in FIG. 1E, the hard mask layer 171 is removed, in accordance with some embodiments of the disclosure. The hard mask layer 171 is removed by an etching process, such as a dry etching process or a wet etching process.

The top electrode 152 has a top surface and a sidewall surface, and the cap layer 170 is in direct contact with the top surface and a portion of the sidewall surface of the top electrode 152. A portion of the cap layer 170 is between the top electrode 152 and the passivation layer 162. After the patterning the cap layer 170, the cap layer 170 has a width that is greater than the width of the top surface of the top electrode 152 to effectively cover the overall top surface of the top electrode 152 when seen from a cross-sectional view.

Next, as shown in FIG. 1F, an etching stop layer 172 is conformally formed on the cap layer 170 and the second dielectric layer 164, and then a third dielectric layer 174 is formed over the etching stop layer 172, in accordance with some embodiments of the disclosure.

The etching stop layer 172 may include silicon carbide (SiC), silicon nitride (SixNy), silicon carbonitride (SiCN), silicon oxycarbide (SiOC), silicon oxycarbon nitride (SiOCN), or another applicable material. In some embodiments, the etching stop layer 172 is formed by a chemical vapor deposition (CVD) process, a spin-on process, a sputtering process, or a combination thereof.

Figure 1G:
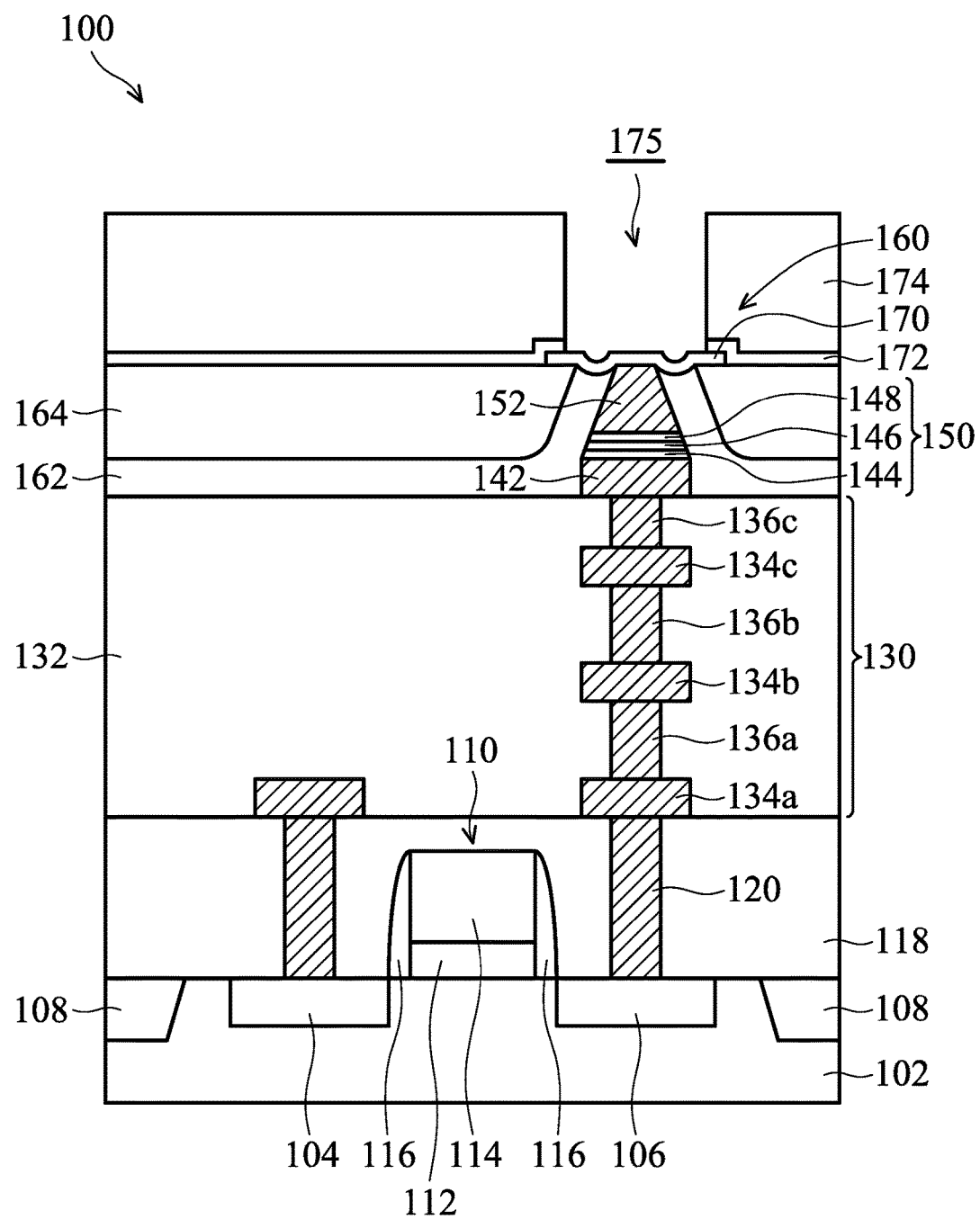

Afterwards, as shown in FIG. 1G, a portion of the third dielectric layer 174 and a portion of the etching stop layer 172 are removed, in accordance with some embodiments of the disclosure. As a result, a trench 175 is formed to expose the cap layer 170. The cap layer 170 has a high etching selectivity with respect to the etching stop layer 172 and the third dielectric layer 174, and therefore the cap layer 170 is not removed during etching the third dielectric layer 174 and the etching stop layer 172.

If no cap layer is directly on the top electrode 152, the second dielectric layer 164 may be over-etched during formation of the trench 175. The trench 175 may extend into a position which is adjacent to the MTJ cell 150, such that the contact structure may be in direct contact with the MTJ cell to degrade the performance of the semiconductor memory structure 100. In order to prevent the second dielectric layer 164 from being over-etched during etching the third dielectric layer 174, the cap layer 170 is pre-formed on the top electrode 152 (as shown in FIG. 1E). The formation of the cap layer 170 provides sufficient protection for the underlying layers and reduces the electrical shorting problems. In addition, when the top electrode 152 is exposed, a native oxide is formed on the top electrode 152. The native oxide may induce high resistance. Since the cap layer 170 is formed on the top electrode 152, the native oxide will not be formed on the top electrode 152. Therefore, the performance of the semiconductor memory structure 100 is improved.

Figure 1H:
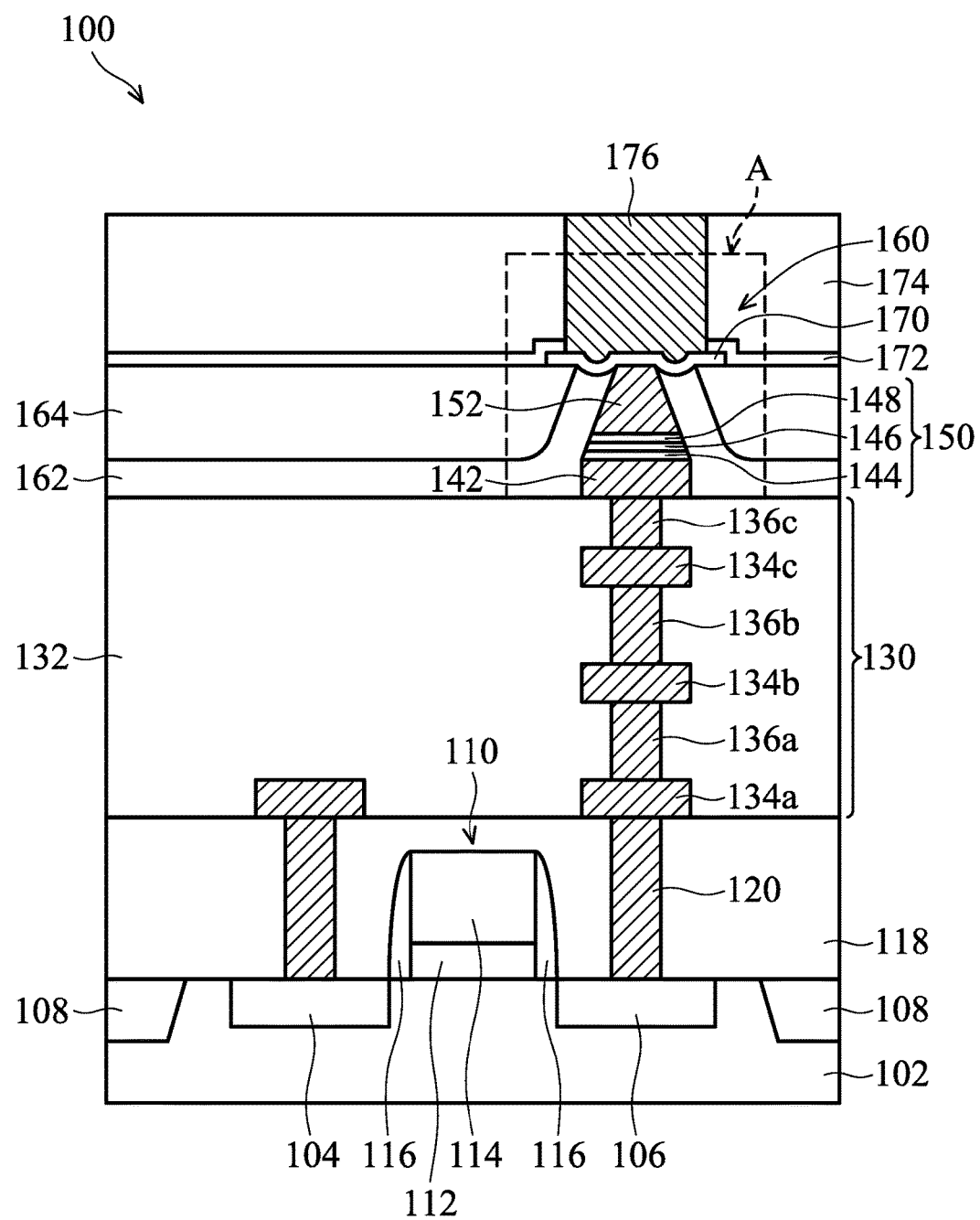

Next, as shown in FIG. 1H, a contact structure 176 is formed in the trench 175, in accordance with some embodiments of the disclosure. The contact structure 176 is electrically connected to the top electrode 152 by the cap layer 170. As mentioned above, the cap layer 170 has a protruding portion which is directly above the recess 165, and a portion of the contact structure 176 is lower than the top surface of the top electrode 152 since the contact structure 176 is conformally formed on the cap layer 170 and the cap layer 170 has a recessed portion (alternatively, a protruding portion).

During removal of the third dielectric layer 174 for forming the trench 175, the width of the trench 175 should not be greater than the width of the cap layer 170. As a result, the cap layer 170 can effectively protect the underlying layers from being etched or damaged. In other words, the width of the cap layer 170 is greater than the width of the trench 175.

The shape of the top electrode 152 may be preserved due to the protection of the cap layer 170, and the top electrode 152 will not be oxidized due to the protection of the cap layer 170. Furthermore, a bottom surface of the cap layer 170 is lower than the top surface of the top electrode 152 and higher than a top surface of the second ferromagnetic layer 148, and the contact structure 176 will not be in direct contact with the MTJ cell 150 due to formation of the cap layer 170. Therefore, the performance of the semiconductor memory structure 100 is improved.

Figure 2:
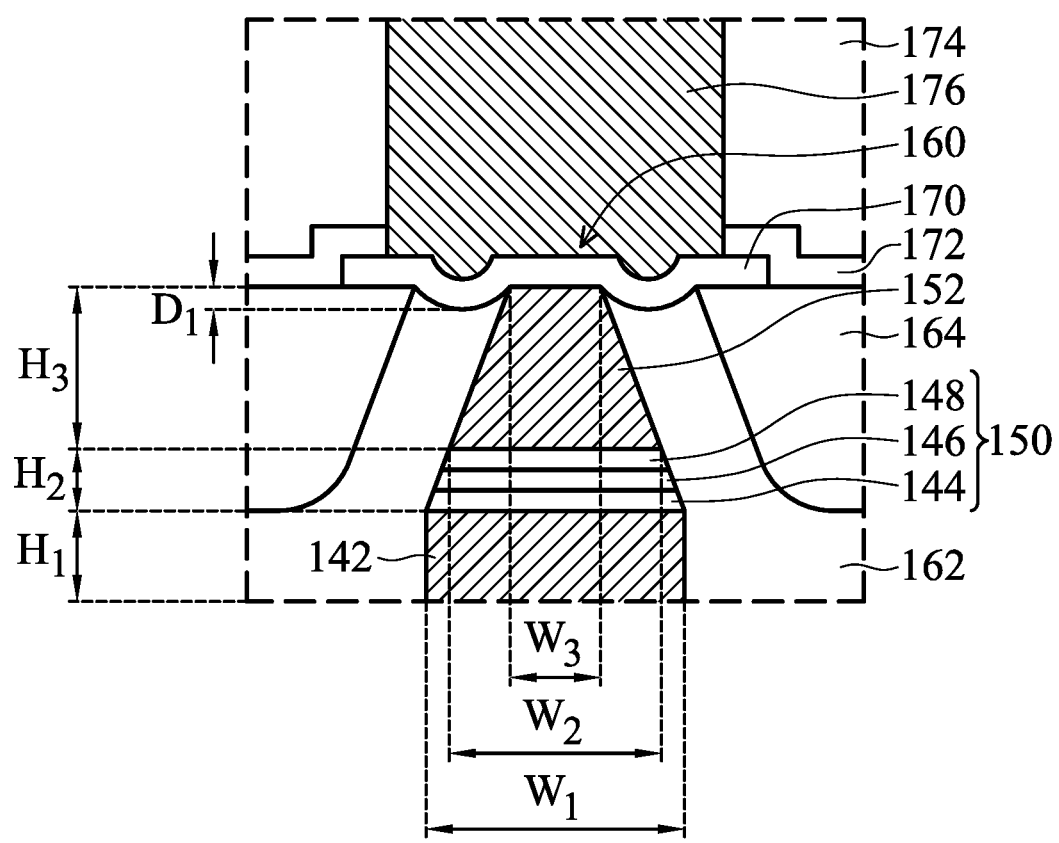
FIG. 2 shows an enlarged cross-sectional view of region A of FIG. 1H, in accordance with some embodiments of the disclosure.

FIG. 2 shows an enlarged cross-sectional view of region A of FIG. 1H, in accordance with some embodiments of the disclosure.

The bottom electrode 142 has a first height $H_1$ and a first width $W_1$. The MTJ cell 150 has a second height $H_2$ and a top surface of the MTJ cell 150 has a second width $W_2$. The top electrode 152 has a third height $H_3$ and the top surface of the top electrode 152 has a third width $W_3$. The first width $W_1$ is greater than the second width $W_2$, and the second width $W_2$ is greater than the third width $W_3$. In some embodiments, the first width $W_1$ is in a range from about 80 nm to about 130 nm. In some embodiments, the second width $W_2$ is in a range from about 50 nm to about 100 nm. In some embodiments, the third width $W_3$ is in a range from about 30 nm to about 80 nm. In some embodiments, the first height $H_1$ is in a range from about 10 nm to about 50 nm. In some embodiments, the second height $H_2$ is in a range from about 10 nm to about 35 nm. In some embodiments, the third height $H_3$ is in a range from about 10 nm to about 50 nm.

FIG. 2 As shown in FIG. 2, a ratio of the first depth $D_1$ of the recess 165 (shown in FIG. 1C) to the third height $H_3$ of the top electrode 152 is in a range from about 40% to about 60%. When the ratio ($D_1/H_3$) is within the above-mentioned range, the risk of electrical shorting is reduced. In some embodiments, the first depth $D_1$ of the recess 165 is in a range from about 5 nm to about 20 nm. The contact structure 176 has a protruding portion which is formed on the recessed portion of the cap layer 170, and therefore the contact structure 176 includes a tiger tooth-shaped structure extended into the passivation layer 162 when seen from a cross-sectional view.

Figure 3:
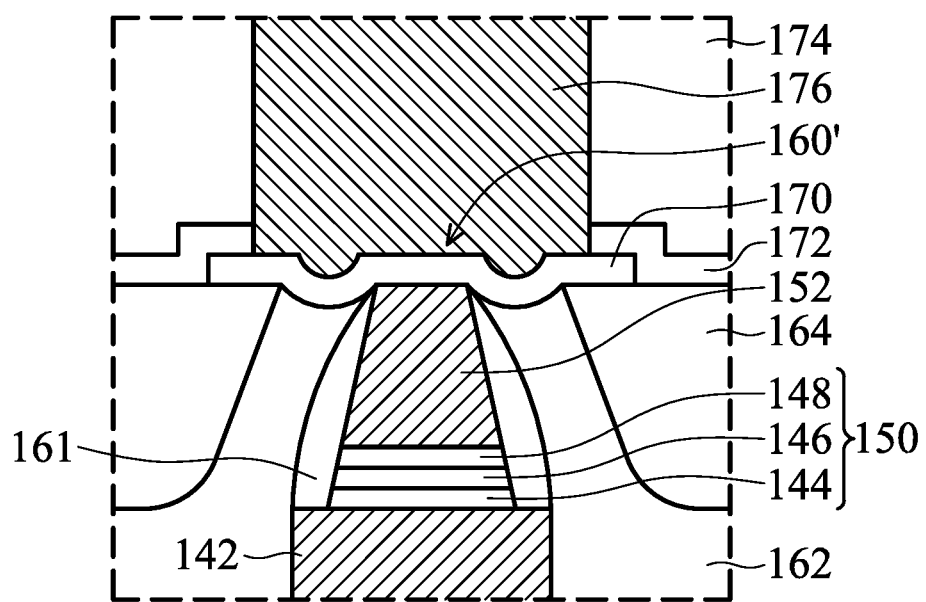
FIG. 3 shows a cross-sectional representation of a memory device, in accordance with some embodiments of the disclosure.

FIG. 3 shows a cross-sectional representation of a memory device 160', in accordance with some embodiments of the disclosure. Some processes and materials used to form the memory device 160' are similar to, or the same as, those used to form the memory device 160 and are not repeated herein.

The difference between FIG. 3 and FIG. 2 is that an additional sidewall spacer layer 161 is formed on sidewall surfaces of the MTJ cell 150 and the top electrode 152 in FIG. 3. The sidewall spacer layer 161 is formed on a portion of the top surface of the bottom electrode 142. A portion of the sidewall spacer layer 161 is between the top electrode 152 and the cap layer 170.

The sidewall spacer layer 161 is used to as a mask when patterning the bottom electrode 142, and it is used as a protection layer form protection of the MTJ cell 150 and the top electrode 152. In some embodiments, the top electrode 152 is firstly patterned, and then the MTJ cell is patterned. Next, a sidewall spacer material is formed on a top surface of the bottom electrode 142 and sidewall surfaces of the top electrode 152, the MTJ cell 150, and then the sidewall spacer material and the bottom electrode 142 are simultaneously patterned to form the sidewall spacer layer 161.

The sidewall spacer layer 161 may be a single layer or a multiple layers. In some embodiments, the sidewall spacer layer 161 is made of dielectric layer, such as silicon oxide, silicon nitride, silicon oxynitride or another applicable material.

Figure 4:
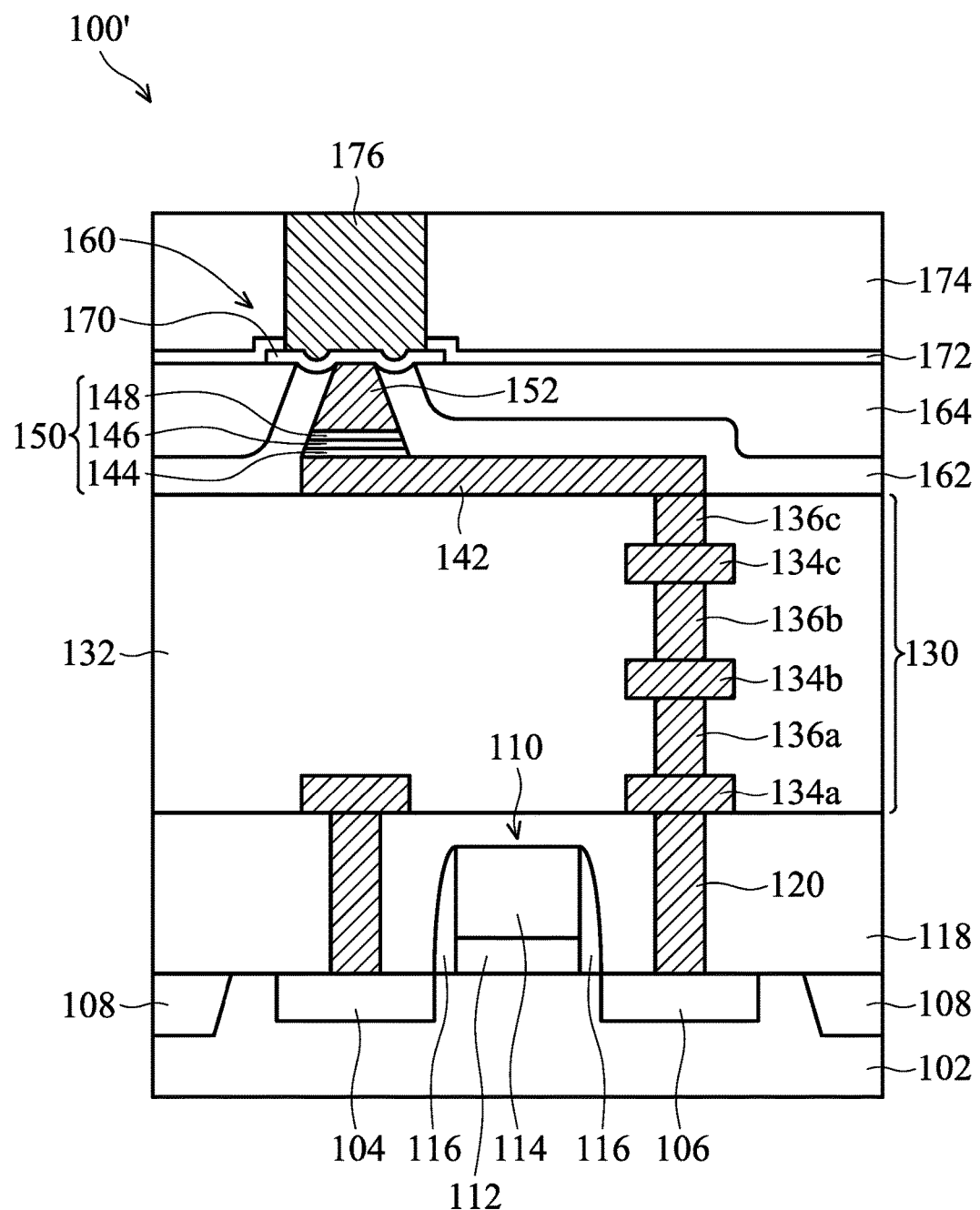
FIG. 4 shows a cross-sectional representation of a semiconductor memory structure, in accordance with some embodiments of the disclosure.

FIG. 4 shows a cross-sectional representation of a semiconductor memory structure 100', in accordance with some embodiments of the disclosure. Some processes and materials used to form the semiconductor memory structure 100' are similar to, or the same as, those used to form the semiconductor memory structure 100 and are not repeated herein.

The memory device 160 is directly above the source region 104. The bottom electrode 142 extends from a first position which is directly above the drain region 106 to a second position which is directly above the source region 104. The cap layer 170 is formed directly on the top electrode 152 to protect the underlying layer being etched or damaged.

The cap layer 170 is formed on and along the shape of the passivation layer 162, and the cap layer 170 has a recessed portion due to the passivation layer 162 has a recessed portion and the cap layer 170 is a thin film. The contact structure 176 is directly formed on the cap layer 170, and it is electrically connected to the top electrode 152 by the cap layer 170.

Embodiments for forming a semiconductor memory structure and method for formation of the same are provided. The semiconductor memory structure includes a bottom electrode over a substrate, a MTH cell over the bottom electrode, and a top electrode over the MTJ cell. A passivation layer is formed to surround the top electrode, the MTJ cell and the bottom electrode, and it has a recessed portion. A cap layer is formed in the recessed portion and on the top surface and a portion of the sidewall surface of the top electrode. The cap layer is used to protect the underlying layers from being etched or damaged, and it prevents the top electrode from being oxidized. Therefore, the performance of the semiconductor memory structure is improved.

In some embodiments, a semiconductor memory structure is provided. The semiconductor memory structure includes a bottom electrode formed over a substrate and a magnetic tunneling junction (MTJ) cell formed over the bottom electrode. The semiconductor memory structure includes a top electrode formed over the MTJ cell and a passivation layer surrounding the top electrode. The passivation layer has a recessed portion that is lower than a top surface of the top electrode. The semiconductor memory structure further includes a cap layer formed on the top electrode and the passivation layer, wherein the cap layer is formed in the recessed portion.

In some embodiments, a semiconductor memory structure is provided. The semiconductor memory structure includes a bottom electrode formed over a substrate and a magnetic tunneling junction (MTJ) cell formed over the bottom electrode. The semiconductor memory structure includes a top electrode formed over the MTJ cell and a passivation layer surrounding the top electrode and the MTJ cell. The semiconductor memory structure further includes a cap layer formed on the top electrode, and the cap layer has a planar portion and a protruding portion. The protruding portion extends into the passivation layer, and a bottom surface of the protruding portion is lower than a top surface of the top electrode.

In some embodiments, a semiconductor memory structure is provided. The semiconductor memory structure includes a bottom electrode formed over a substrate and a first ferromagnetic layer formed on the bottom electrode. The semiconductor memory structure includes an insulator layer formed on the first ferromagnetic layer and a second ferromagnetic layer formed on the insulator layer. The semiconductor memory structure also includes a top electrode formed over the second ferromagnetic layer, and the top electrode comprises a top surface and a sidewall surface. The semiconductor memory structure further includes a passivation layer surrounding the top electrode and a cap layer formed on the top electrode, wherein the top surface and a portion of the sidewall surface of the top electrode are in direct contact with the cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory structure, comprising:
a bottom electrode formed over a substrate;
a magnetic tunneling junction (MTJ) cell formed over the bottom electrode;
a top electrode formed over the MTJ cell;
a passivation layer formed over the substrate, the passivation layer extending along corresponding sides of the top electrode, wherein a top surface of the passivation layer has a recessed portion that is lower than a top surface of the top electrode;
a dielectric layer formed on the passivation layer, wherein the top surface of the top electrode is level with a top surface of the dielectric layer; and
a conductive cap layer formed on the top electrode, the passivation layer, and the dielectric layer, wherein the conductive cap layer extends along a top surface of the dielectric layer, into the recessed portion, and along the top surface of the top electrode.

2. The semiconductor memory structure as claimed in claim 1, wherein the MTJ cell comprises:

a first ferromagnetic layer formed on the bottom electrode;

an insulator layer formed on the first ferromagnetic layer; and a second ferromagnetic layer formed on the insulator layer.

3. The semiconductor memory structure as claimed in claim 2, wherein the first ferromagnetic layer has a bottom surface with a bottom width, the second ferromagnetic layer has a top surface with a top width, and the bottom width is greater than the top width.

4. The semiconductor memory structure as claimed in claim 1, wherein the recessed portion has a depth, and the top electrode has a height, and a ratio of the depth to the height is in a range from about 40% to about 60%.

5. The semiconductor memory structure as claimed in claim 1, further comprising:

a transistor device formed over the substrate; and an interconnect structure formed over the transistor device, wherein the interconnect structure comprises a metal layer, and the metal layer is electrically connected to the bottom electrode.

6. The semiconductor memory structure as claimed in claim 1, further comprising:

a contact structure formed over the top electrode, wherein the contact structure is electrically connected to the top electrode by the conductive cap layer.

7. The semiconductor memory structure as claimed in claim 6, wherein the contact structure has a protruding portion extending into a position which is directly above the recessed portion of the passivation layer.

8. The semiconductor memory structure as claimed in claim 1, further comprising:

a sidewall spacer layer formed on sidewall surfaces of the top electrode and the MTJ cell, wherein a portion of the sidewall spacer layer is between the top electrode and the conductive cap layer.

9. The semiconductor memory structure as claimed in claim 1, wherein the top electrode has a top surface and a sidewall surface, and the conductive cap layer is in direct contact with the top surface and a portion of the sidewall surface.

10. A semiconductor memory structure, comprising:

a bottom electrode formed over a substrate;

a magnetic tunneling junction (MTJ) cell formed over the bottom electrode;

a top electrode formed over the MTJ cell;

a passivation layer formed over the substrate, the passivation layer extending along corresponding sides of the top electrode and the MTJ cell, wherein a top surface of the passivation layer has a recessed portion, which is lower than a top surface of the top electrode;

a cap layer formed on the top electrode, wherein the cap layer has a protruding portion, which extends into the recessed portion of the passivation layer, and a bottom surface of the protruding portion is lower than the top surface of the top electrode; and a contact structure formed on the cap layer, wherein the contact structure is separated from the top electrode by the cap layer.

11. The semiconductor memory structure as claimed in claim 10, further comprising:

a transistor device formed over the substrate; and an interconnect structure formed over the transistor device, wherein the interconnect structure comprises a metal layer, and the metal layer is electrically connected to the bottom electrode.

12. The semiconductor memory structure as claimed in claim 11, further comprising:

a drain region formed in the substrate; and a source region formed in the substrate, wherein the drain region and the source region are at opposite sides of the transistor device, and the drain region is electrically connected to the bottom electrode.

13. The semiconductor memory structure as claimed in claim 10, wherein the MTJ cell comprises:

a first ferromagnetic layer formed on the bottom electrode;

an insulator layer formed on the first ferromagnetic layer; and a second ferromagnetic layer formed on the insulator layer.

14. The semiconductor memory structure as claimed in claim 10, wherein a portion of the cap layer is between the top electrode and the passivation layer.

15. The semiconductor memory structure as claimed in claim 10, wherein a portion of the contact structure is lower than a top surface of the cap layer.

16. A semiconductor memory structure, comprising:

a bottom electrode formed over a substrate;

a first ferromagnetic layer formed on the bottom electrode;

an insulator layer formed on the first ferromagnetic layer;

a second ferromagnetic layer formed on the insulator layer;

a top electrode formed over the second ferromagnetic layer, wherein the top electrode comprises a top surface and a sidewall surface;

a passivation layer surrounding the sidewall surface of the top electrode, wherein a top surface of the passivation layer adjacent the top electrode has a recessed portion, which is lower than a top surface of the top electrode; and a cap layer formed on the top electrode, wherein the cap layer extends into the recessed portion of the passivation layer, the top surface and a portion of the sidewall surface of the top electrode are in direct contact with the cap layer, and the cap layer is electrically connected to the top electrode.

17. The semiconductor memory structure as claimed in claim 16, further comprising:

a transistor device formed over the substrate;

a drain region formed in the substrate; and a source region formed in the substrate, wherein the drain region and the source region are at opposite sides of the transistor device, and the bottom electrode is directly over the drain region.

18. The semiconductor memory structure as claimed in claim 16, further comprising:

a contact structure formed on the cap layer, wherein the contact structure is electrically connected to the top electrode by the cap layer.

19. The semiconductor memory structure as claimed in claim 16, wherein a bottom surface of the cap layer is higher than a top surface of the first ferromagnetic layer.

20. The semiconductor memory structure as claimed in claim 6, wherein a projection of the contact structure on a top surface the substrate is in a range of a projection of the conductive cap layer on the top surface of the substrate.

* * * * *